United States Patent
Chen et al.

(10) Patent No.: US 7,127,021 B2
(45) Date of Patent: Oct. 24, 2006

(54) INTERLEAVED PULSE-EXTENDED PHASE DETECTOR

(75) Inventors: Shin Chung Chen, Los Gatos, CA (US); Roubik Gregorian, Saratoga, CA (US); Mir Bahram Ghaderi, Cupertino, CA (US); Vincent Sing Tso, Milpitas, CA (US)

(73) Assignee: Exar Corporation, Fremont, CA (US)

( * ) Notice: Subject to any disclaimer, the term of this patent is extended or adjusted under 35 U.S.C. 154(b) by 724 days.

(21) Appl. No.: 10/199,620

(22) Filed: Jul. 19, 2002

(65) Prior Publication Data
US 2004/0012414 A1     Jan. 22, 2004

(51) Int. Cl.
*H03D 3/24* (2006.01)
(52) U.S. Cl. .................................................. 375/375
(58) Field of Classification Search ................. 375/324, 375/375; 327/107, 236, 141, 142, 143, 144, 327/146, 147, 148, 149, 150, 151, 152, 153, 327/154, 155, 156, 157, 158, 159, 160, 161; 331/25
See application file for complete search history.

(56) References Cited

U.S. PATENT DOCUMENTS

| | | | | |
|---|---|---|---|---|
| 5,307,028 A | * | 4/1994 | Chen | 331/1 A |
| 5,731,723 A | * | 3/1998 | Chen | 327/157 |
| 2002/0154722 A1 | * | 10/2002 | Djahanshahi et al. | 375/375 |

* cited by examiner

*Primary Examiner*—Khanh Tran
*Assistant Examiner*—Sam K. Ahn
(74) *Attorney, Agent, or Firm*—Townsend and Townsend and Crew LLP

(57) ABSTRACT

A mechanism for dealing with faster clock speeds by increasing the pulse width of the pump-up and pump-down pulses of a Hogge-type phase detector without dividing the clock. In particular, the NRZ data stream is divided into two, interleaved data streams which are provided through two series of flip-flops. By connecting the exclusive-OR gates separately to the two series of flip-flops to generate the pump-up and pump-down pulses, a longer time between transitions can be achieved by having alternate transitions (up and down) used by the two different series of flip-flops. In addition, delay circuits are provided to compensate for the clock-to-data output delay of the flip-flops.

10 Claims, 6 Drawing Sheets

INTERLEAVED PULSE-EXTENDED PHASE DETECTOR

CROSS-REFERENCES TO RELATED APPLICATIONS

Co-owned application Ser. No. 10/118,661, filed Apr. 8, 2002, entitled "Clock and Data Recovery Circuit for Return-to-Zero Data" also uses a modified Hogge detector, but for RZ data.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates to phase detectors for Non-Return-to-Zero (NRZ) data.

One type of phase detector is the Hogge phase detector, which is described in U.S. Pat. No. 4,535,459. The Hogge phase detector provides good performance by detecting the phase at the mid-point of a pulse, where there is maximum noise immunity.

The above-referenced co-pending application modifies a Hogge phase detector for use in a Return-to-Zero (RZ) phase detector. The present invention, on the other hand, is directed to a different modification for improved use with NRZ data.

NRZ data has recently been popularized in the synchronous optical network (SONET) protocol used in fiber optics. The Hogge detector produces pump-up and pump-down signals which control the charge in the charge pump to provide a correction signal used in tracking and synchronizing with the incoming data. As clock speeds become faster, the pump-up and pump-down signals are shorter, leading to potential errors. One method for addressing this is to divide down the clock signal. However, this generates a separate problem with clock skew. An additional problem with high-speed data is that the clock-to-data output delay through the flip-flops used in a Hogge detector become significant with respect to the clock period. An example of a patent which discusses and addresses clock to data delay is Pat. No. 6,316,966.

Accordingly, it would be desirable to have a circuit which could implement a Hogge detector in a manner which can handle high-speed data without errors, and without clock skew.

BRIEF SUMMARY OF THE INVENTION

The present invention provides a mechanism for dealing with faster clock speeds by increasing the pulse width of the pump-up and pump-down pulses without dividing the clock. In particular, the NRZ data stream is divided into two, interleaved data streams which are provided through two series of flip-flops. By connecting the exclusive-OR gates separately to the two series of flip-flops to generate the pump-up and pump-down pulses, a longer time between transitions can be achieved by having alternate transitions (up and down) used by the two different series of flip-flops. In addition, delay circuits are provided to compensate for the clock-to-data output delay of the flip-flops.

In one embodiment, the NRZ data stream is fed to cascaded flip-flops with feedback to divide the input NRZ data into interleaved data streams. One data stream corresponds to the data in, and the other to the inverse of the data in. The signals from these initial flip-flops to the exclusive-OR gates of the two series of flip-flops are provided through a clock-to-Q delay circuit. The input of the two data streams are recombined through an exclusive-OR gate and a flip-flop to provide re-timed data output.

In one embodiment, the pulse down exclusive-OR gate is connected to the outputs of the second and fourth flip-flops in the series. In another embodiment, the pump-down signal exclusive-OR gate has its inputs connected to the outputs of the first and third flip-flops.

For a further understanding of the nature and advantages of the invention, reference should be made to the following description taken in conjunction with the accompanying drawings.

DETAILED DESCRIPTION OF THE INVENTION

Figure 1:
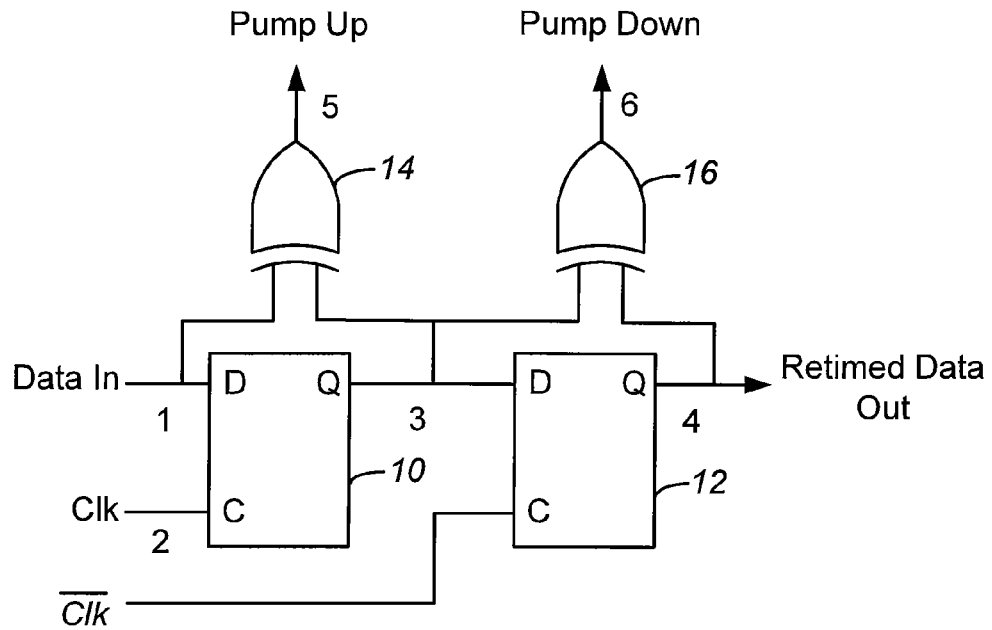
FIG. 1 is a diagram of a prior art Hogge phase detector producing pump-up and pump-down signals.
Figure 2:
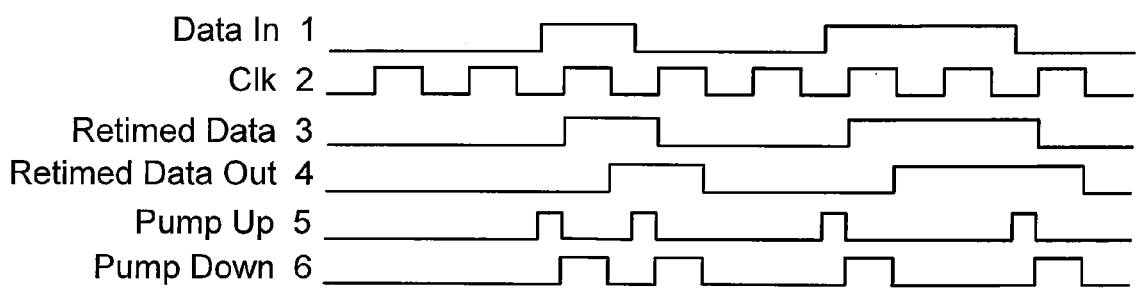
FIG. 2 is a timing diagram corresponding to the detector of FIG. 1.

FIG. 1 shows a simple prior art Hogge phase detector using flip-flops 10 and 12 connected in series, with the first flip-flop being clocked by the clock signal and the second by the inverse of the clock signal. The data input and data output of the first flip-flop are provided to an exclusive-OR gate 14 which provides a pump-up signal for a charge pump in the phase detector, as is known in the art. A second exclusive-OR gate 16 has inputs connected to the outputs of the two flip-flops and provides a pump-down signal to the charge pump. FIG. 2 illustrates the timing of the signals of the circuit of FIG. 1, with the numbers 1–6 corresponding to the labeled signals in FIG. 1.

Figure 3:
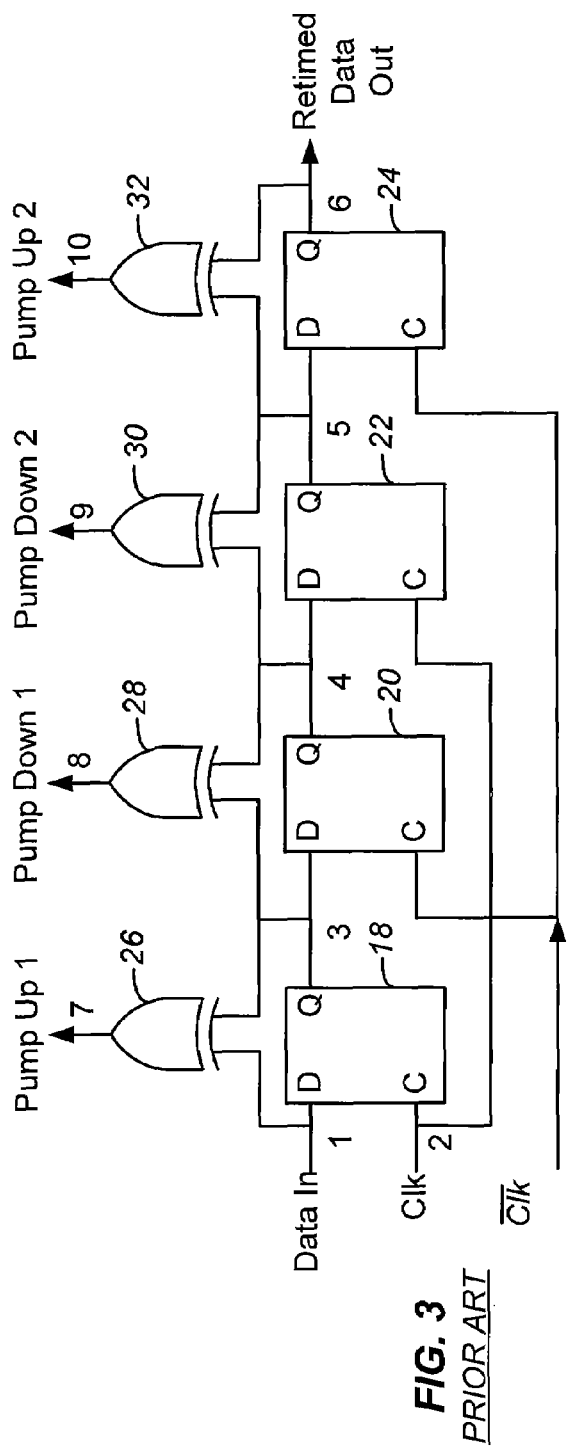
FIG. 3 is a prior art Hogge detector producing two pump-up and two pump-down signals.
Figure 4:
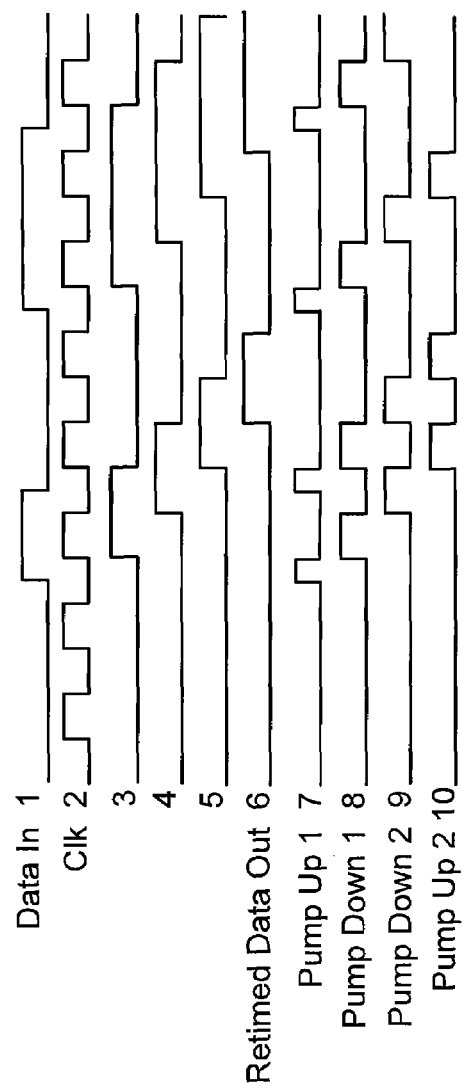
FIG. 4 is a timing diagram illustrating the signals of the detector of FIG. 3.

FIG. 2 is a modification of the circuit of FIG. 1 which is used to equalize the effects of unequaled duty cycles. This circuit provides four flip-flops 18, 20, 22 and 24 connected in series. Similarly, four exclusive-OR gates 26, 28, 30 and 32 are used to provided two different pump-up and pump-down signals. FIG. 4 shows the timing for the signals labeled 1–10 in FIG. 3. For a description of how the pump-up and pump-down signals are used, and other aspects of a Hogge phase detector, see previously referenced U.S. Pat. No. 4,535,459.

When a high-speed signal is provided to the architecture of FIG. 1 or FIG. 2, a number of difficulties arise. For example, even simple digital latches or the charge pumps fail to respond to narrow input pulses, resulting in erroneous detection or suffering non-linearities in the closed-loop responses. On the one hand, it is desirable to lengthen the time intervals between corrections for the latches to operate correctly. On the other hand, it is desirable to extend the phase detector output pulses (the pump-up and pump-down signals) so that the charge pump can respond with desired linearity.

Figure 5:
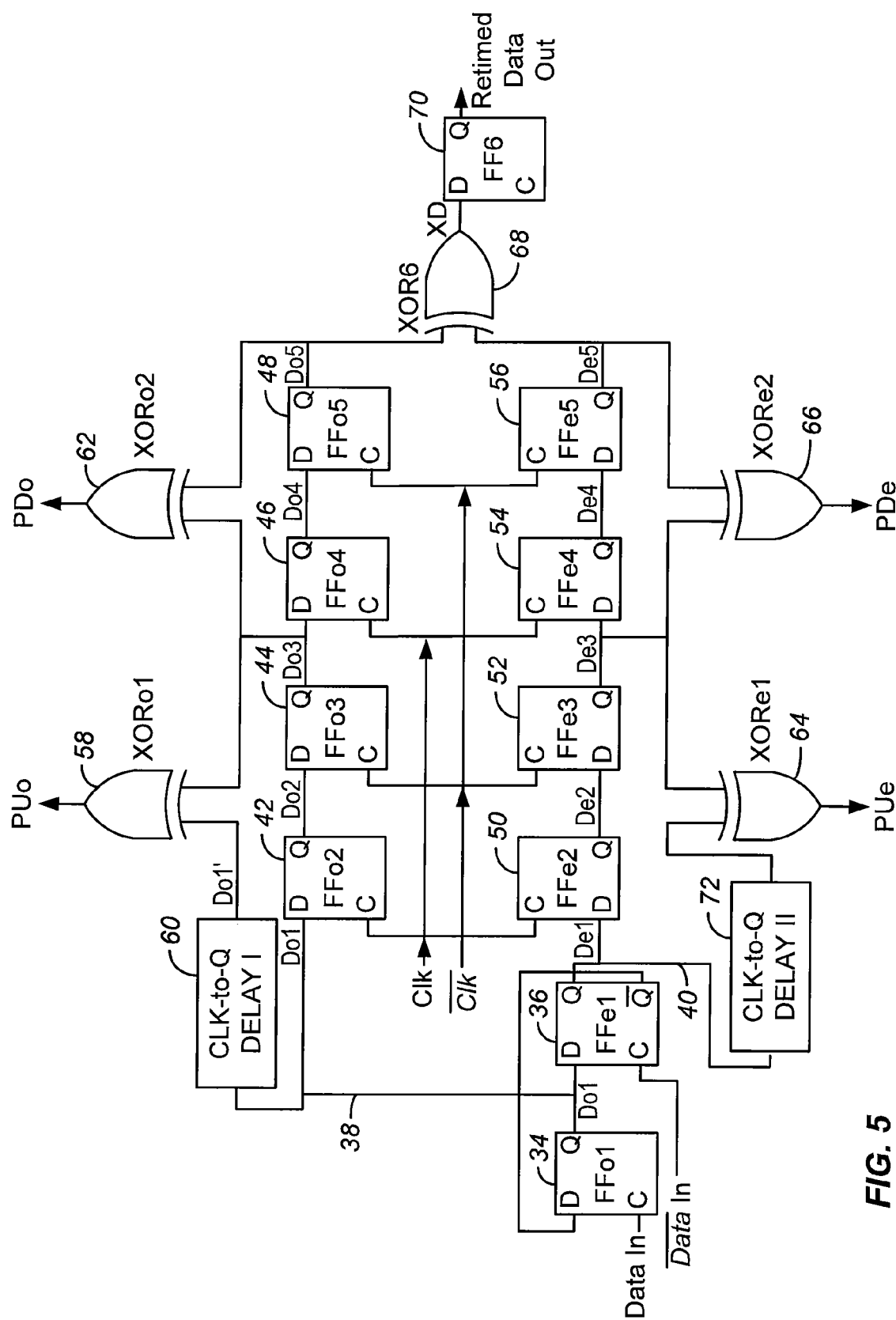
FIG. 5 is a block diagram of a first embodiment of the invention with interleaved data streams.

FIG. 5 shows a first embodiment of a phase detector according to the present invention which provides interleaved pulse-extended phase detection. An input NRZ Data In stream is provided to the clock input of a flip-flop 34, while the inverse of the Data In stream is provided to the clock input of a cascaded flip-flop 36. The inverse Q output of flip-flop 36 is fed back to the data input of flip-flop 34. The data output of flip-flop 34 provides a first, or odd data stream on line 38, while the output of flip-flop 36 on line 40 provides the second, or even data stream. In this way, the toggling nature of the NRZ data format is re-created at the two flip-flop outputs by their respective rising edges of the Data In and Data In inverse signals at the clock inputs of the flip-flops.

The odd data stream on line 38 feeds into a series of four flip-flops 42, 44, 46 and 48. The even data stream output of flip-flop 36 feeds into a series of four flip-flops 50, 52, 54 and 56.

An exclusive-OR gate 58 has its inputs connected to line 38, through a delay circuit 60, and the output of flip-flop 44. Exclusive-OR gate 58 produces a pump-up signal at its output. A second exclusive-OR gate 62 is connected to the outputs of flip-flops 44 and 48, to produce pump-down signal. Similarly, for the even data stream, exclusive-OR gates 64 and 66 are connected in a similar manner. These signals are recombined in an exclusive-OR gate 68 and provided through a flip-flop 70 to provide re-timed data out.

By dividing the data into two different data streams, which trigger on different transitions of the Data In, the pulse width is widened for each of the exclusive-OR gates. The pump-up pulse width of exclusive-OR gates 58 and 64 will vary from one-half to one-and-one-half periods of the clock, depending upon the phase difference between the clock and data. On the other hand, the pulse down signals from exclusive-OR gates 62 and 66 will have a constant pulse width of exactly one clock period. This can be seen from the timing diagram of FIG. 6 corresponding to the labeled signals in FIG. 5. Thus, the pulse width of all of these signals are at least one-half of a clock period.

Delay circuit 60 and corresponding delay circuit 72 for the even data stream provide a delay corresponding to the clock-to-data output delay of the flip-flops. This provides that the first input to exclusive-OR gates 58 and 64 is delayed by the same amount as the second input of these exclusive-OR gates, which passes through the flip-flop and is accordingly delayed.

In steady-state, the input clock duty cycle becomes immaterial since the pulse widths of the pump-up and pump-down signals are both equal to one clock period. The present invention extends the pump-up and pump-down signals by one-half of a clock period over the prior art circuits. This, when coupled with the interleaving architecture, relaxes the stringent speed requirements of the flip-flop, exclusive-OR gate and charge pump circuits. As a result, the functionality of the Clock and Data Recovery (CDR) system in which the phase detector of the invention is used will become more realizable and the linearity of the CDR will be improved.

Figure 7:
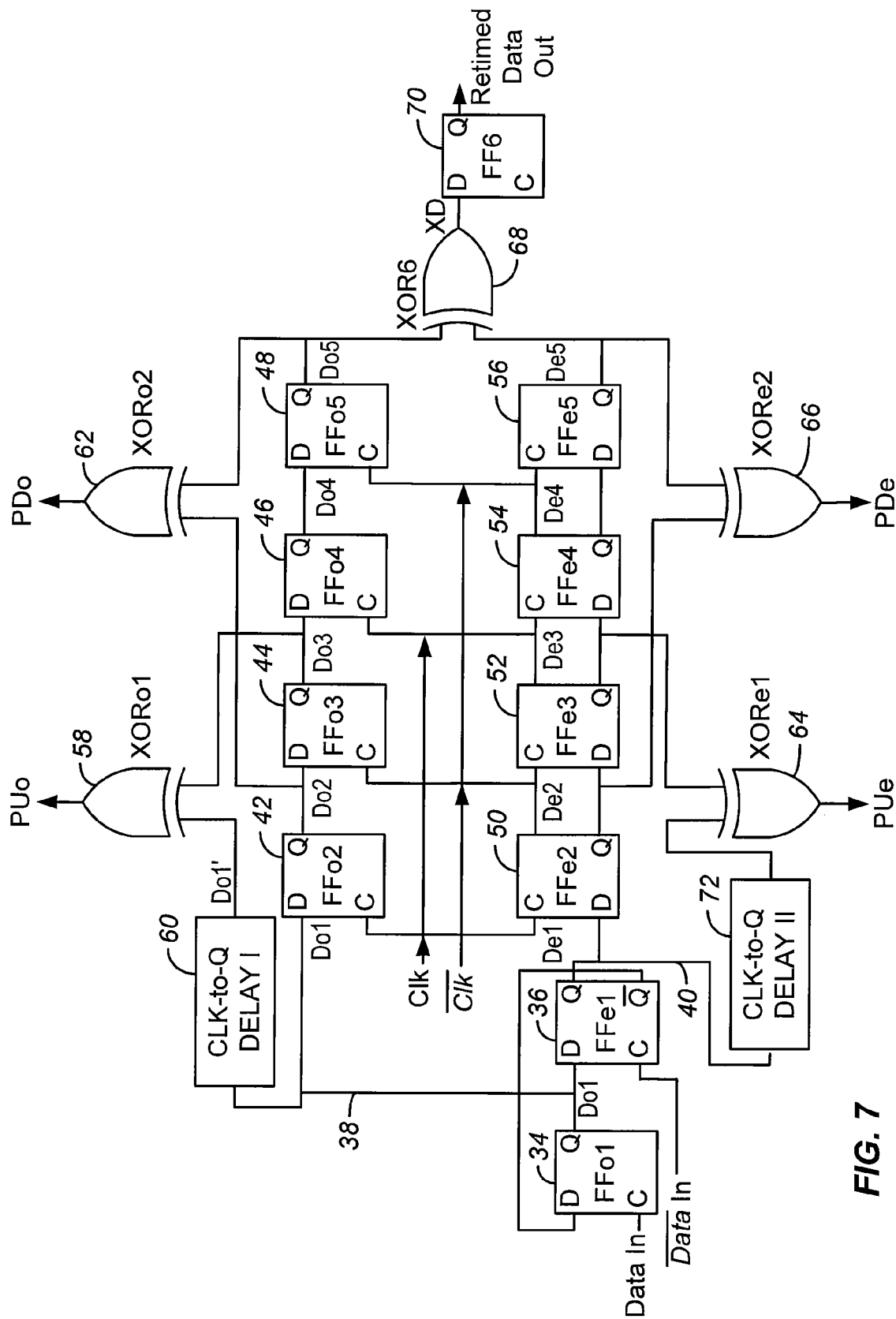
FIG. 7 is a block diagram of an alternate embodiment of the invention with two data streams.

FIG. 7 shows an alternate embodiment which is nearly identical to that of FIG. 5, except that the inputs of exclusive-OR gate 62 are the outputs of first flip-flop 42 and third flip-flop 46. This contrasts with using the outputs of the second and fourth flip-flops in FIG. 5. The inputs of exclusive-OR gate 66 are similarly configured. Flip-flops 48 and 56 thus are not needed for generating pump-down signals in FIG. 7, but are included for load equalization and to re-time the data. In the embodiment of FIG. 5, a preferred embodiment would add a dummy load to the output of delay circuit 60 and the output of flip-flop 48 to equalize the loads presented to the exclusive-OR gates. Similar loads would be added for the exclusive-OR gates of the even data stream.

Figure 6:
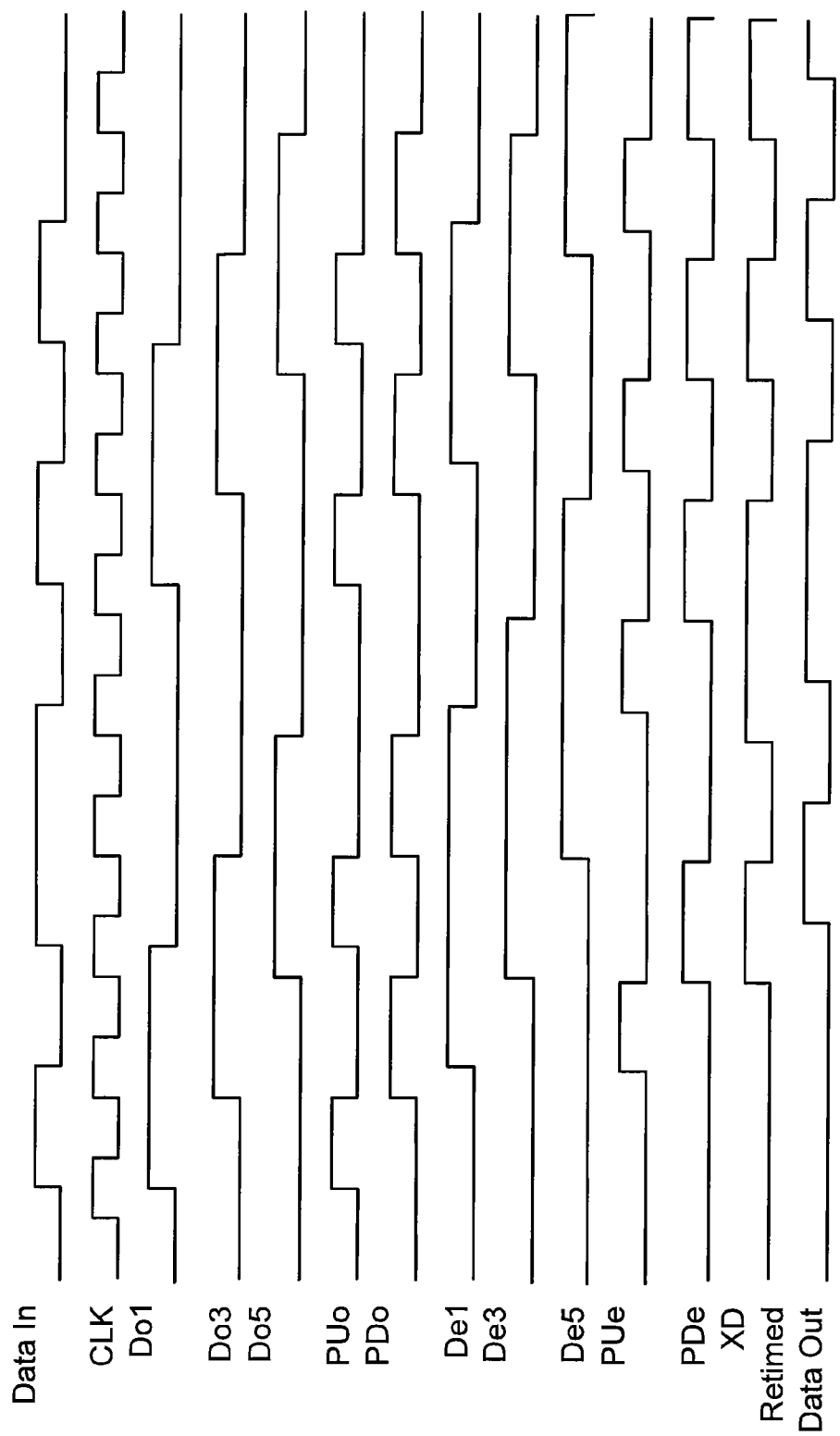
FIG. 6 is a timing diagram illustrating the signals for the detector of FIG. 5.
Figure 8:
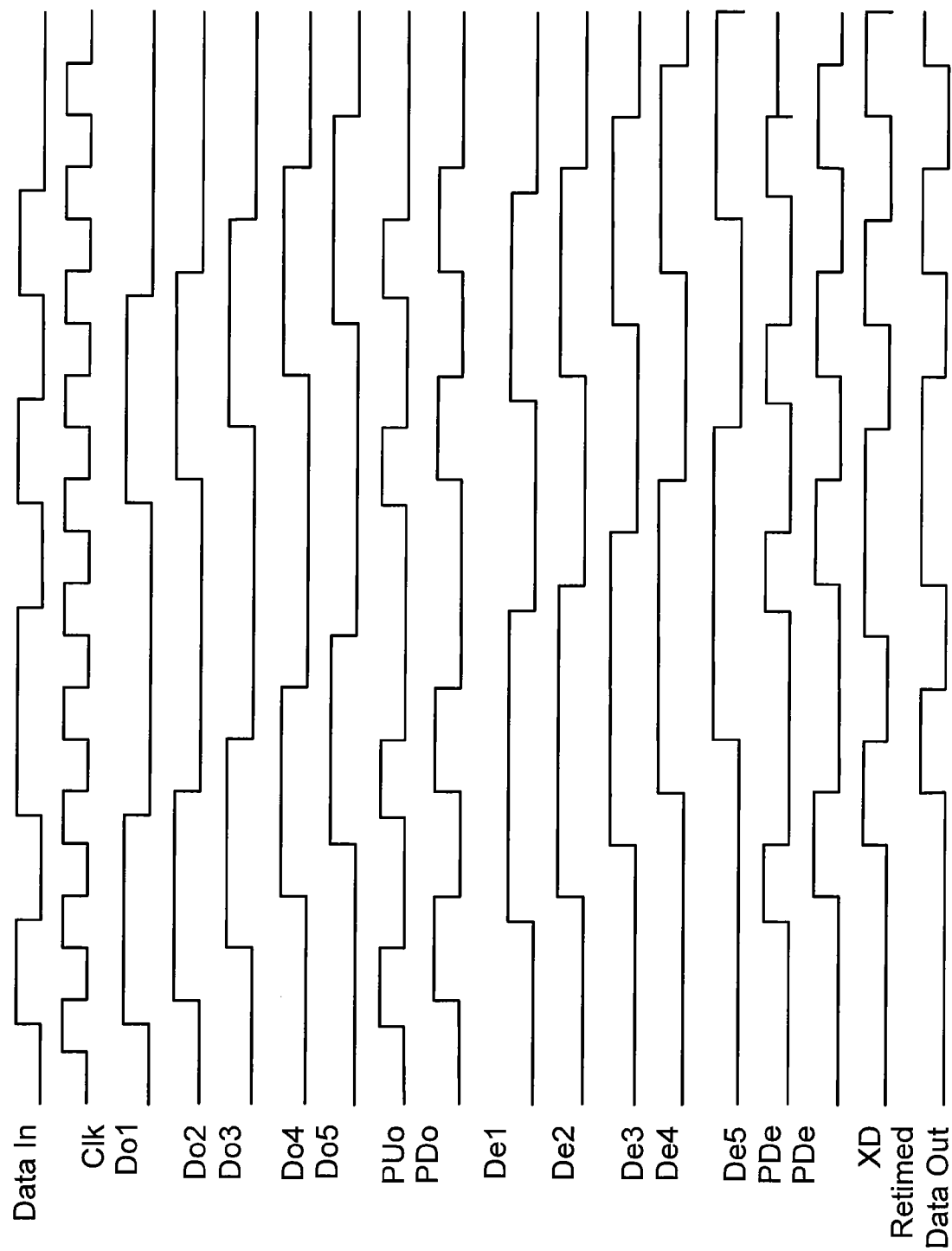
FIG. 8 is a timing diagram illustrating the signals for the detector of FIG. 7.

Looking at the timing diagrams of FIGS. 6 and 8, it can be seen that the pulses provided by the flip-flops are at one-half the data input rate, thus widening the pulses used to generate the pump-up and pump-down signals.

As will be understood by those skilled in the art, the present invention may be embodied in other specific forms without departing from the essential characteristics thereof. For example, a different circuit arrangement could be used to divide the data stream into odd and even streams or latches could be used in place of eight flip-flops 34, 36, 44, 46, 48, 52, 54 and 56 to produce the same outputs. Accordingly, the foregoing description is intended to be illustrative, but not limiting, of the scope of the invention which is set forth in the following claims.

What is claimed is:

1. A phase detector for Non-Return-to-Zero (NRZ) data, comprising:
   a first circuit for dividing an input NRZ data stream into first and second data streams corresponding to the input NRZ data stream and the inverse of the input NRZ data stream, respectively;
   a first series of flip-flops through which the first data stream is propagated;
   first and second exclusive-OR gates each having a first input coupled to said first series of flip-flops to provide first pulse-up and pulse-down signals;
   a second series of flip-flops through which the second data stream is propagated;
   third and fourth exclusive-OR gates each having a first input coupled to said second series of flip-flops to provide second pulse-up and pulse-down signals;
   a first delay circuit for providing the first data stream to a second, input of said first exclusive-OR gate; and
   a second delay circuit for providing the second data stream to a second input of said third exclusive-OR gate, wherein a second input of said second exclusive-OR gate is coupled to a data output of a fourth flip-flop in said first series of flip-flops, and wherein a second input of said fourth exclusive-OR gate is coupled to a data output of a fourth flip-flop in said second series of flip-flops.

2. The phase detector of claim 1 wherein a delay of said first and second delay circuits corresponds to a clock-to-output delay of at least one of said first and second series of flip-flops.

3. The phase detector of claim 1 wherein said first circuit comprises:
   a fifth flip-flop having a clock input connected to said input NRZ data stream;

a sixth flip-flop having a clock input connected to the inverse of said input NRZ data stream;

an inverse data output of said sixth flip-flop being connected to a data input of said fifth flip-flop;

a data output of said fifth flip-flop providing said first data stream; and a data output of said sixth flip-flop providing said second data stream.

4. The phase detector of claim 1 wherein said first exclusive-OR gate has a second input connected to a data output of a second flip-flop in said first series of flip-flops; and said second exclusive-OR gate has the first input connected to said data output of said second flip-flop in said first series of flip-flops, and a second input connected to a data output of a fourth flip-flop in said first series of flip-flops.

5. The phase detector of claim 1 wherein said first exclusive-OR gate has a second input connected to a data output of a second flip-flop in said first series of flip-flops; and said second exclusive-OR gate has the first input connected to a data output of a first flip-flop in said first series of flip-flops, and a second input connected to a data output of a third flip flop in said first series of flip-flops.

6. The phase detector of claim 1 further comprising:

a fifth exclusive-OR gate having inputs connected to the outputs of last flip-flops in said first and second series of flip-flops.

7. A phase detector for Non-Return-to-Zero (NRZ) data, comprising:

a first circuit for dividing an input NRZ data stream into first and second data streams corresponding to the input NRZ data stream and the inverse of the input NRZ data stream, respectively;

a first series of flip-flops through which the first data stream is propagated;

first and second exclusive-OR gates each having a first input coupled to said first series of flip-flops to provide first pulse-up and pulse-down signals;

a second series of flip-flops through which the second data stream is propagated;

third and fourth exclusive-OR gates each having a first input coupled to said second series of flip-flops to provide second pulse-up and pulse-down signals;

a first delay circuit for providing the first data stream to a second input of said first exclusive-OR gate;

a second delay circuit for providing the second data stream to a second input of said third exclusive-OR gate;

wherein a delay of said first and second delay circuits corresponds to a clock-to-output delay of at least one of said first and second series of flip-flops;

wherein said first exclusive-OR gate has a second input connected to a data output of a second flip-flop in said first series of flip-flops; and wherein said second exclusive-OR gate has a first input connected to a data output of said second flip-flop in said first series of flip-flops, and a second input connected to a data output of a fourth flip flop in said first series of flip-flops.

8. A phase detector for Non-Return-to-Zero (NRZ) data, comprising:

a first circuit for dividing an input NRZ data stream into first and second data streams corresponding to the input NRZ data stream and the inverse of the input NRZ data stream, respectively;

a first series of flip-flops through which the first data stream is propagated;

first and second exclusive-OR gates each having a first input coupled to said first series of flip-flops to provide first pulse-up and pulse-down signals;

a second series of flip-flops through which the second data stream is propagated;

third and fourth exclusive-OR gates each having a first input coupled to said second series of flip-flops to provide second pulse-up and pulse-down signals;

a first delay circuit for providing the first data stream to a second input of said first exclusive-OR gate;

a second delay circuit for providing the second data stream to a second input of said third exclusive-OR gate;

wherein a delay of said first and second delay circuits corresponds to a clock-to-output delay of at least one of said first and second series of flip-flops;

wherein said first exclusive-OR gate has a second input connected to a data output of a second flip-flop in said first series of flip-flops; and wherein said second exclusive-OR gate has a first input connected to a data output of a first flip-flop in said first series of flip-flops, and a second input connected to a data output of a third flip flop in said first series of flip-flops.

9. A method for detecting a phase for Non-Return-to-Zero (NRZ) data, comprising:

dividing an input NRZ data stream into first and second data streams corresponding to the input NRZ data stream and the inverse of the input NRZ data stream, respectively;

propagating the first data stream through a first series of flip-flops;

exclusive-ORing outputs from a first and fourth flip-flops of said first series of flip-flops to provide first pulse-up and pulse-down signals;

propagating the second data stream through a second series of flip-flops;

exclusive-ORing outputs from a first and fourth flip-flops of said second series of flip-flops to provide second pulse-up and pulse-down signals;

first delaying the second data stream to an input of said first exclusive-OR gate; and second delaying the second data stream to an input of said third exclusive-OR gate.

10. The method of claim 9 wherein a delay of said first delaying corresponds to a clock-to-output delay of at least one flip-flop of said first or second series of flip-flops.

* * * * *